United States Patent
Anil et al.

(10) Patent No.: US 10,720,565 B2
(45) Date of Patent: Jul. 21, 2020

(54) PIEZOELECTRIC COMPOSITION, METHODS AND APPLICATIONS THEREOF

(71) Applicants: Department of Electronics and Information Technology, New Delhi (IN); Centre for Materials for Electronics Technology, Pune (IN)

(72) Inventors: Adukkadan Anil, Thrissur (IN); Vattappilly Priyadarsini, Thrissur (IN); Mani Iyer Sathyanarayanan, Thrissur (IN); Viswanathan Kumar, Thrissur (IN)

(73) Assignees: Department of Electronics and Information Technology, New Delhi (IN); Centre for Materials for Electronics Technology, Pune (IN)

( * ) Notice: Subject to any disclaimer, the term of this patent is extended or adjusted under 35 U.S.C. 154(b) by 626 days.

(21) Appl. No.: 15/152,674

(22) Filed: May 12, 2016

(65) Prior Publication Data

US 2016/0380179 A1 Dec. 29, 2016

(30) Foreign Application Priority Data

May 15, 2015 (IN) .......................... 1372/DEL/2015

(51) Int. Cl.
| | | |
|---|---|---|
| H01L 41/187 | (2006.01) | |
| C04B 35/499 | (2006.01) | |
| C04B 35/491 | (2006.01) | |
| C04B 35/634 | (2006.01) | |
| C04B 35/638 | (2006.01) | |
| C04B 35/64 | (2006.01) | |
| H01L 41/43 | (2013.01) | |
| B28B 11/24 | (2006.01) | |

(52) U.S. Cl.
CPC ........ *H01L 41/1876* (2013.01); *B28B 11/243* (2013.01); *C04B 35/491* (2013.01); *C04B 35/499* (2013.01); *C04B 35/638* (2013.01); *C04B 35/63416* (2013.01); *C04B 35/64* (2013.01); *H01L 41/43* (2013.01); *C04B 2235/3213* (2013.01); *C04B 2235/3215* (2013.01); *C04B 2235/3236* (2013.01); *C04B 2235/3243* (2013.01); *C04B 2235/3249* (2013.01); *C04B 2235/3255* (2013.01); *C04B 2235/3268* (2013.01); *C04B 2235/3296* (2013.01); *C04B 2235/604* (2013.01); *C04B 2235/656* (2013.01); *C04B 2235/6562* (2013.01); *C04B 2235/6567* (2013.01); *C04B 2235/66* (2013.01)

(58) Field of Classification Search
CPC .................................................. H01L 41/1876
See application file for complete search history.

(56) References Cited

FOREIGN PATENT DOCUMENTS

EP 0525590 * 2/1993

OTHER PUBLICATIONS

B.Jaffe, W.R.Cook, Jr and H.Jaffe, pp. 237-242 in Piezoelectric Ceramics [Eds.J.B.Roberts, and P.Popper, Academic Press. NY.1971].
F.A.Kroger and H.J.Vink, Solid state Physics (Eds.F.Seitz and D.Turnbull, Academic Press, NY, 1956).

* cited by examiner

*Primary Examiner* — Larry W Thrower
(74) *Attorney, Agent, or Firm* — Harness, Dickey & Pierce, P.L.C.

(57) ABSTRACT

The present disclosure relates to piezoelectric compositions of Formula I comprising Lead Zirconate—Lead Titanate solid solution. The disclosure further relates to a method of obtaining said composition, method of preparing/fabricating piezoelectric component(s) and piezoelectric component(s)/article(s) obtained thereof. The piezoelectric composition and articles of the present disclosure show excellent electromechanical characteristics along with very large insulation resistance (IR).

5 Claims, No Drawings

PIEZOELECTRIC COMPOSITION, METHODS AND APPLICATIONS THEREOF

CROSS-REFERENCE TO RELATED APPLICATIONS

This application claims the benefit and priority of Indian Application No. 1372/DEL/2015 filed May 15, 2015. The entire disclosure of the above application is incorporated herein by reference.

TECHNICAL FIELD

The present disclosure is in the field of electronics and mechanical engineering. The present disclosure relates to piezoelectric compositions comprising Lead Zirconate—Lead Titanate solid solution having excellent piezoelectric properties. In particular, the disclosure relates to piezoelectric ceramic composition, which is useful in preparing/fabricating piezoelectric component(s) to achieve excellent electromechanical characteristics along with very large insulation resistance (IR).

BACKGROUND AND PRIOR ART OF THE DISCLOSURE

Piezoelectricity is referred as the electric charge that accumulates in certain solid materials (such as crystals, certain ceramics etc.) in response to applied mechanical stress. In general, 'piezoelectricity' means electricity resulting from application of pressure and vice-versa and has useful applications such as in the production and detection of sound, generation of high voltages, electronic frequency generation, microbalances, to drive an ultrasonic nozzle, and ultrafine focusing of optical assemblies.

Piezoelectric compositions have been widely investigated and used in a variety of piezoelectric components like transducers, ultrasonic receivers, generators etc. Consequently, the use of piezoelectric ceramic compositions to form piezocomponents is increasing. Piezoelectric compositions having higher electromechanical coupling efficiency ($k_p > 0.56$), mechanical quality factor ($Q_m > 500$) and low dielectric loss (tan $\delta \leq 0.004$) are in great demand for high power applications. Piezoelectric components for transducers demand piezoelectric compositions that can also yield enhanced insulation resistance, IR$\geq$10 G$\Omega$. Existing high power piezoelectric ceramics do not simultaneously exhibit suitable electromechanical properties and high insulation resistance. In the current state of art, the existing piezoelectric components that exhibit sufficiently high electromechanical characteristics have low insulation resistance, usually $\leq$10 G$\Omega$, which is not adequate especially for high power transducer applications.

The piezoelectric properties of piezoelectric elements can be varied by addition of certain foreign constituents. Sintering cycles and poling process have an effect on fabrication of piezoelement of desired physical properties and electromechanical characteristics. However, it is difficult to optimise these processes to fabricate specific piezoceramic components having desired electromechanical characteristics as well as high IR. In other words, it is technically very difficult to prepare a piezoelectric component through a known set of process parameters. Therefore, the development of new piezoceramic composition and its intended application often demand practising of a different fabrication method because processing methods can have influence on the physical and electromechanical characteristics of piezoceramics.

As piezoelements are sought after in various applications, the demand for new piezoelectric compositions and piezoelectric components derived from them is very important. However, the need of the hour is that the piezoelectric compositions and the corresponding piezocomponents must possess improved insulation resistance along with high electromechanical characteristics.

U.S. Pat. No. 3,376,226 claims piezoelectric ceramic composition having a solid solution of lead-zirconate titanate-stannate modified by adding thorium oxide and chromium oxide improving electro mechanical coupling factor ($k_p \sim 0.59$) and providing mechanical quality factor ($Q_m \sim 400$).

U.S. Pat. No. 3,268,453 relates to piezoelectric ceramic compositions of ternary and binary systems containing solid solutions of PMN-PT-PZ modified by additional constituents and articles of manufacture fabricated therefrom. In addition, several patents such as U.S. Pat. Nos. 3,546,120, 3,649,540, 3,890,241 relate to piezoceramic compositions having piezoelectric properties meeting the specific application fields of transducers, sensors etc.

It is clear from the above discussion that piezoceramic compositions are known in the art for various applications. However, the simultaneous requirements of high insulation resistance and improved electromechanical characteristicsare not met by the piezocomponents of the prior art. Accordingly, there has been a continuing need in the art to provide better and significantly improved piezoceramic systems having high values of electromechanical coupling efficiency and mechanical quality factor along with very large insulation resistance in component form. The present disclosure aims at overcoming the aforesaid drawbacks of the prior art.

STATEMENT OF THE DISCLOSURE

Accordingly, the present disclosure relates to a composition of Formula I:

$$(Pb_{1-w}A_w)(Zr_{1-a}Ti_a)_x M^{III}_y M^V_z O_3$$

wherein,
'A' is selected from a group comprising Sr and Ba, or a combination thereof,
'$M^{III}$' is selected from a group comprising Cr, Nd and Mn, or any combination thereof,
'$M^V$' is selected from a group comprising Nb and Ta, or a combination thereof,
'w' ranges from about 0.80 to 2.70 wt %,
'y' ranges from about 0.017 to 0.170 wt %,
'z' ranges from about 0.03 to 0.60 wt %, and
'x' ranges from about 0.96768 to 0.99800;
a process for preparing the composition of Formula I:

$$(Pb_{1-w}A_w)(Zr_{1-a}Ti_a)_x M^{III}_y M^V_z O_3$$

wherein,
'A' is selected from a group comprising Sr and Ba, or a combination thereof,
'$M^{III}$' is selected from a group comprising Cr, Nd and Mn, or any combination thereof,
'$M^V$' is selected from a group comprising Nb and Ta, or a combination thereof,
'w' ranges from about 0.80 to 2.70 wt %,
'y' ranges from about 0.017 to 0.170 wt %,
'z' ranges from about 0.03 to 0.60 wt %, and 'x' ranges from about 0.96768 to 0.99800,
said process comprising step of step of mixing metal precursors selected from a group comprising metal oxide, metal carbonate, metal acetate and combinations thereof, to obtain said composition;

a piezoelectric article comprising the composition of formula I:

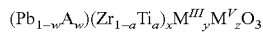

wherein,
'A' is selected from a group comprising Sr and Ba, or a combination thereof,
'$M^{III}$' is selected from a group comprising Cr, Nd and Mn, or any combination thereof,
'$M^{V}$' is selected from a group comprising Nb and Ta, or a combination thereof,
'w' ranges from about 0.80 to 2.70 wt %,
'y' ranges from about 0.017 to 0.170 wt %,
'z' ranges from about 0.03 to 0.60 wt %, and
'x' ranges from about 0.96768 to 0.99800;
and, a method of fabricating a piezoelectric article using the composition of formula I

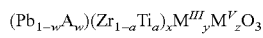

wherein,
'A' is selected from a group comprising Sr and Ba, or a combination thereof,
'$M^{III}$' is selected from a group comprising Cr, Nd and Mn, or any combination thereof,
'$M^{V}$' is selected from a group comprising Nb and Ta, or a combination thereof,
'w' ranges from about 0.80 to 2.70 wt %,
'y' ranges from about 0.017 to 0.170 wt %,
'z' ranges from about 0.03 to 0.60 wt %, and
'x' ranges from about 0.96768 to 0.99800,
comprising acts of:
a) pulverizing the piezoelectric composition as described above followed by drying to obtain a powder,
b) mixing the powder with alcohol to obtain a dough,
c) granulating the dough to form granules,
d) pressing the granules to obtain green compact, and
e) sintering the green compact to obtain the fabricated piezoelectric article.

DETAILED DESCRIPTION OF THE DISCLOSURE

The present disclosure relates to a composition of Formula I:

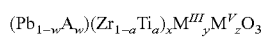

wherein,
'A' is selected from a group comprising Sr and Ba, or a combination thereof,
'$M^{III}$' is selected from a group comprising Cr, Nd and Mn, or any combination thereof,
'$M^{V}$' is selected from a group comprising Nb and Ta, or a combination thereof,
'w' ranges from about 0.80 to 2.70 wt %,
'y' ranges from about 0.017 to 0.170 wt %,
'z' ranges from about 0.03 to 0.60 wt %, and
'x' ranges from about 0.96768 to 0.99800.

In an embodiment of the present disclosure, the above composition is a piezoelectric ceramic composition.

In another embodiment of the present disclosure, in the above composition, the ratio of Zr:Ti range from about 0.8867 to about 1.1276, and the ratio of $M^{III}:M^{V}$ range from about 1.0 to 0.40.

In yet another embodiment of the present disclosure, the above composition possess permittivity ($\varepsilon_r$) ranging from about 1279 to 1754, electromechanical coupling efficiency ($k_p$) ranging from about 0.57 to 0.61, mechanical quality factor ($Q_m$) ranging from about 665 to 1097, and dielectric loss (tan δ) ranging from about 0.002 to 0.003.

In still another embodiment of the present disclosure, the above composition possesses insulation resistance (IR) ranging from 130 GΩ to about 400 GΩ.

The present disclosure further relates to a process for preparing the above composition, said process comprising step of mixing metal precursors selected from a group comprising metal oxide, metal carbonate, metal acetate and combinations thereof, to obtain said composition.

In an embodiment of the present disclosure, the metal oxide in the above process is selected from a group comprising $PbO$, $SrO$, $BaO$, $ZrO_2$, $TiO_2$, $Mn_2O_3$, $Cr_2O_3$, $Nd_2O_3$, $Ta_2O_5$, $Nb_2O_5$ and combinations thereof, the metal carbonate is selected from a group comprising $PbCO_3$, $SrCO_3$, $BaCO_3$ and combinations thereof, and the metal acetate is selected from a group comprising $Pb(CH_3COO)_2 \cdot nH_2O$, $Ba(CH_3COO)_2$, $Mn(CH_3COO)_3 \cdot nH_2O$, $Cr_3(OH)_2(CH_3COO)_7$, $Nd(CH_3COO)_3 \cdot nH_2O$ and combinations thereof.

In another embodiment of the present disclosure, the above process for preparing the composition of further comprises steps of:
a) pulverizing the mixed metal precursors to obtain a mixture, and
b) calcining the mixture to obtain the piezoelectric composition, wherein said calcination is carried out at a temperature ranging from about 650° C. to 900° C. for a time-period ranging from about 2 hours to 4 hours and a heating rate of about 250° C. to 350° C. per hour.

The present disclosure further relates to a piezoelectric article comprising the composition of formula I:

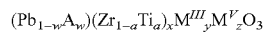

wherein,
'A' is selected from a group comprising Sr and Ba, or a combination thereof,
'$M^{III}$' is selected from a group comprising Cr, Nd and Mn, or any combination thereof,
'$M^{V}$' is selected from a group comprising Nb and Ta, or a combination thereof,
'w' ranges from about 0.80 to 2.70 wt %,
'y' ranges from about 0.017 to 0.170 wt %,
'z' ranges from about 0.03 to 0.60 wt %, and
'x' ranges from about 0.96768 to 0.99800.

The present disclosure also relates to a method of fabricating the above piezoelectric article comprising acts of:
c) pulverizing the above piezoelectric composition followed by drying to obtain a powder,
d) mixing the powder with alcohol to obtain a dough,
e) granulating the dough to form granules,
f) pressing the granules to obtain green compact, and
g) sintering the green compact to obtain the fabricated piezoelectric article.

In another embodiment of the present disclosure, the pulverization step in the above mentioned processes is carried out for a time-period ranging from about 24 hours to 32 hours.

In yet another embodiment of the method of fabricating the piezoelectric article, the step (e) is carried out at a temperature ranging from about 1100° C. to 1400° C., preferably at a temperature ranging from about 1200° C. to 1300° C., and for a time period ranging from about 1 hour to 4 hours, preferably for a time period ranging from about 2 hours to 3 hours.

In still another embodiment of the method of fabricating the piezoelectric article, the alcohol is polyvinyl alcohol (PVA) at a strength ranging from about 2% to 10%, preferably about 5%.

In still another embodiment of the method of fabricating the piezoelectric article, the particle size of granules in step (c) range from about 400 μm to 500 μm.

In still another embodiment of the method of fabricating the piezoelectric article, the granules in step (d) are pressed into shapes selected from a group comprising ring shape, plate and disc.

In still another embodiment of the method of fabricating the piezoelectric article, the sintering in step (e) is carried out in a crucible in presence of lead zirconate and titania in a controlled manner.

The present disclosure is addressed to the aforementioned needs in the art and provides for piezoelectric composition, piezocomponents fabricated with said piezoelectric composition and corresponding methods. The piezoelectric composition of the disclosure has improved electromechanical properties (high values of electromechanical coupling efficiency, permittivity and mechanical quality factor, and low dielectric loss) and very large insulation resistance.

As used herein, the terms "composition", "piezoelectric composition", "piezoelectric ceramic composition" and "ceramic composition" are employed interchangeably within the instant disclosure and refer to the composition of the instant disclosure.

The piezoelectric composition of the present disclosure is derived from lead titanate—lead zirconate solid solution containing Lead, Barium, Strontium, Titanium, Zirconium, Chromium, Niobium, Neodymium, Manganese and Tantalum.

The present disclosure also relates to fabricating piezo-ceramic components with the composition to achieve simultaneous improved electromechanical properties and very large insulation resistance. In an embodiment, piezoelectric components of the present disclosure having very large insulation resistance (IR) along with improved dielectric and piezoelectric properties are suited for high power transducer applications.

In another embodiment of the present disclosure, processes for preparing piezoelectric composition and fabricating piezoceramic components with said composition is provided.

The piezoelectric composition of the present disclosure has the following general formula I:

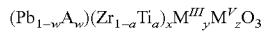

wherein,

A is either Sr or Ba or both and 'w' ranges from about 0.80 to about 2.70 wt %;

$M^{III}$ is either Cr or Nd or Mn or combination of these and 'y' ranges from about 0.017 to about 0.170 wt %;

$M^{V}$ is either Nb or Ta or both and 'z' ranges from about 0.03 to about 0.60 wt %; and 'x' ranges from about 0.96768 to 0.99800.

In an embodiment of the present disclosure, the Pb (Lead)/A (either Sr or Ba, or both) ratio in Formula I is varied to provide a composition with the desired electromechanical characteristics.

In another embodiment of the present disclosure, the ratio of Zr:Ti in Formula I varies from about 0.8667 to about 1.1276.

In still another embodiment of the present disclosure, the ratio of the $M^{III}$:$M^{V}$ in Formula I varies from about 1.0 to about 0.40. In preferable embodiment of the present disclosure, the ratio of $M^{V}$:$M^{III}$ maintains at 2.0.

The relative ratios of various components of Formula I are selected as mentioned above to provide a ceramic composition having a structure that lies at or near the morphotropic phase boundary (MPB) between the tetragonal and rhombohedral phases over a wide temperature range. The piezoelectric composition or Formula I of the present disclosure can be provided in a single phase. The composition exists as a complex perovskite structure with dopants incorporated at both A and B sites of the Perovskite. A simple perovskite structure has the general formula $ABO_3$ where A is a divalent ion, B is tetravalent ion and O is Oxygen ion. The complex perovskites have the general formula A (B'B") $O_3$ or (A'A") $BO_3$ with two ions of different valencies and size in A and/or B sites. The composition of the present disclosure exist as a complex perovskite structure with dopants incorporated at both A and B sites and has the structure (A'A") (B'B") $O_3$.

In yet another embodiment of the present disclosure, the piezoelectric compositions instant disclosure exhibit high permittivity ($\varepsilon_r$ of about 1279 to about 1754, preferably ≥1300), high electromechanical coupling efficiency ($k_p$ of about 0.57 to about 0.61, preferably ≥0.60), high mechanical quality factor ($Q_m$ of about 665 to about 1097, preferably >650), low dielectric loss (tan δ of about 0.002 to about 0.003, preferably ≤0.002) and high insulation resistance (IR of about 130 GΩ to about 400 GΩ, preferably >100 GΩ).

The piezoelectric ceramic composition of the present disclosure is prepared by mixing the precursor metal oxides, carbonates and acetates in distilled water and pulverising by roll milling for about 24 hours to about 32 hours using stabilized zirconia balls. The ratio between weight of ground media (containing mixture of precursor oxides/carbonates/acetates), weight of zirconia balls and water is maintained as 1:2:1.

In an embodiment, known metal oxides and/or metal carbonates are employed for the preparation of composition of the present disclosure. For instance, oxides, carbonates and acetates of Lead can be selected from a group comprising but not limited to PbO, $PbCO_3$ and $Pb(CH_3COO)_2 \cdot nH_2O$, or any combination thereof; Oxides and carbonates of Strontium can be selected from a group comprising but not limited to SrO and $SrCO_3$, or any combination thereof; Oxides, carbonates and acetates of Barium can be selected from a group comprising but not limited to $BaCO_3$ and BaO, $Ba(CH_3COO)_2$, or any combination thereof; Oxides of Zirconium can be selected from $ZrO_2$ or the likes; Oxides of Titanium can be selected from $TiO_2$ or the likes; Oxides and acetates of Manganese can be selected from a group comprising but not limited to $Mn_2O_3$ and $Mn(CH_3COO)_3 \cdot nH_2O$, or any combination thereof; oxides and acetates of Chromium can be selected from a group comprising but not limited to $Cr_2O_3$ and $Cr_3(OH)_2(CH_3COO)_7$, or any combination thereof; oxides and acetates of Neodymium can be selected from a group comprising but not limited to $Nd_2O_3$ and $Nd(CH_3COO)_3 \cdot nH_2O$, or any combination thereof; Oxides of Niobium can be selected from $Nb_2O_5$ or the likes; and Oxides of Tantalum can be selected from $Ta_2O_5$ or the likes.

The resulting pulverized mixture as obtained above is dried, preferably in an air oven, at elevated temperatures between about 100° C. and about 130° C. The dried powder is then milled in mortar and pestle and calcined to form desired tetragonal crystal phase. The dried powder is then heated to a temperature less than 900° C., more preferably ranging from about 650° C. to about 900° C. over a period of time. Heating rate preferably selected is about 250° C. to 350° C. per hour. The powder is held at an elevated temperature for a time period preferably ranging from at about 2 hours to about 4 hours. After this, the powder is allowed to cool to room temperature. The heating rate and holding period of calcination can be varied as these parameters depend on the mass of powder and physical characteristics of the components derived from the same.

The calcined powder is re-pulverized in a ball mill as mentioned above using the ratio 1:4:1 instead of ratio 1:2:1 for about 24 hours to about 32 hours. The slurry obtained post re-pulverization is passed through a sieve for obtaining uniform particle size and then dried in an air oven at temperature of about 100° C. to about 130° C.

The fine powder obtained as above is mixed with polyvinyl alcohol (PVA), preferably 5% PVA solution. The calcined powder is mixed with PVA solution first to form a paste then it is converted to dough by drying the paste through heating. The above dough is granulated into smaller particles and passed through a sieve in order to get fine particles of uniform size (400-500 μm). These particles are pressed into designed shape, ring or plate etc. which are then referred to as green compacts.

The green compacts are sintered in an alumina crucible having diameter of about 75 mm and height of 30 mm and covered with lid of same having diameter of about 75 mm and 3 mm thickness. Pre-sintered lead zirconate powder mixed with titania powder (preferably about 10-15 wt %) is used for providing the required atmosphere for minimising compositional variation during this sintering process. This pre-sintered powder is placed along with green compact either in powder form or compact form, or both. Thereafter, the green article/compact is sintered at an elevated temperature about 1200° C. to about 1300° C. The green compact is held at three temperatures at near about 300° C., 600° C. and 1100° C. for a period of about 20 minutes to 3 hours. The binder is removed at the first temperature region in a controlled manner.

The sintered bodies are lapped on both sides and annealed at a temperature of about 70-80% of sintering temperature before the dimensional and density measurements.

Polished ceramic is electroded by using silver paste subsequently cured at about 700° C. Finally, article was polarized while immersed in silicone oil bath at 60-80° C. by applying 1.2-1.5 kV per mm thickness of the element. The ceramic is poled in such a way that the electric field is applied for a time period of about 15 minutes to about 30 minutes and at a temperature of about 60-80° C. and slowly ramp down to room temperature by maintaining the field across the electrodes. Electric field is applied only after desired temperature is reached and increased at the rate of 0.5 kV per 5 minutes. The piezo-electromechanical properties are measured after about 48 hours. The resulting piezo-elements are used according to desired applications.

Additional embodiments and features of the present disclosure will be apparent to one of ordinary skill in art based upon description and examples provided herein. However, the examples below should not be construed to limit the scope of the present disclosure.

EXAMPLES

For the following examples, all dielectric measurements were performed by Impedance/Gain phase analyser (Model 4192A, Agilent Technologies Palo Alto, Calif.). The measured parameters are capacitance, dielectric loss (tan δ), resonance ($f_r$) and antiresonance ($f_a$) frequencies. Electro mechanical coupling factor ($k_p$) and Mechanical quality factor ($Q_m$) were calculated from resonance measurements. The $d_{33}$ constant was measured in a $d_{33}$ meter (Piezometer System, Piezotest 300, Canada). The insulation resistance was measured at an applied voltage (1000 V) using an insulation tester C.A 6543, CHAUVIN ARNOUX.

While preferred embodiments have been shown and described in the forthcoming Examples, various modifications and substitutions may be made thereto without departing from the spirit and scope of the present disclosure. Accordingly, it is to be understood that apart from the piezoceramic compositions/articles disclosed in Examples 1A to 1J, a person of average skill in the art can arrive at all other possible compositions under Formula I based on the description/examples of the present disclosure. Arriving at such compositions of the present Formula I is within the scope of the present disclosure and does not require any extraordinary technical effort.

Example 1

Preparation of Compositions of Formula I (A) The metal oxides carbonates and acetates are weighed in proportions according to the following formula:

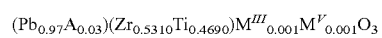

where
'A' is Sr,
'$M^{III}$' is a combination of Cr and Mn; and
'$M^V$' is Nb;
Metal oxide/carbonate equivalents, PbO=222.8976 g, $SrCO_3$=4.4286 g, $ZrO_2$=65.4298 g, $TiO_2$=37.4590 g, $Mn_2O_3$=0.0789 g, $Cr_2O_3$=0.0759 g and $Nb_2O_5$=0.2658 g are taken for preparation of the composition. The powder-water-grinding balls mixture is pulverised for about 24 hours and dried. The dried powder is calcined more preferably at about 700° C. to 900° C. for about 2 hours to about 4 hours using heating rate of about 250° C. to 350° C. per hour. The calcined powder is re-pulverised and dried. The powder is then converted into dough by blending with 5% polyvinyl alcohol (PVA, molecular weight approximately 125000) solution. The granulated fine powder is pressed into ring disc or ring (annular) shaped green compact and sintered at about 1200° C.-1300° C. for about1 hour to about 3 hours. The sintered article is lapped and annealed, and then painted with silver paste on both sides following curing at about 700° C. The article is then poled at about 70° C. by applying 1.3 kV per mm thickness in silicone oil. The measurements are done after about 48 hours. [The poled ceramic exhibits a uniform microstructure. The electromechanical properties are evaluated and are listed (for a disc shaped specimen) in Table 1].

(B) The metal oxides carbonates and acetates are weighed in proportions according to the following formula:

where
A is Sr;
$M^{III}$ is a combination of Cr and Mn; and
$M^V$ is Nb;
Metal oxide/carbonate equivalents, PbO=220.1582 g, $SrCO_3$=5.9048 g, $ZrO_2$=65.7625 g, $TiO_2$=37.2433 g, $Mn_2O_3$=0.2368 g, $Cr_2O_3$=0.0759 g, and $Nb_2O_5$=1.3290 g are taken for preparation of the composition. The slurry is prepared similar to as described in Example 1A, and is dried.

The dried powder is calcined more preferably at about 700° C. to 900° C. for about 2 hours to about 4 hours using heating rate of about 250° C. to 350° C. per hour. The sample/specimen is further processed as described in Example 1A to obtain article fabricated with the composition of Formula I. [The poled ceramic exhibits a uniform microstructure. The electromechanical properties are evaluated and are listed (for a disc shaped specimen) in Table 1].

(C) The metal oxides, carbonates and acetates are weighed in proportions according to the following formula:

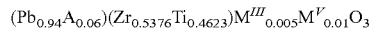

where

A is Sr;

$M^{III}$ is a combination of Cr and Mn; and $M^V$ is Nb;

Metal oxide/carbonate equivalents, PbO=215.0313 g, $SrCO_3$=8.8572 g, $ZrO_2$=66.2430 g, $TiO_2$=36.9239 g, $Mn_2O_3$=0.6315 g, $Cr_2O_3$=0.1519 g and $Nb_2O_5$=2.6581 g are taken for preparation of the composition. The slurry is prepared similar to as described in Example 1A, and is thereafter dried. The dried powder is calcined more preferably at about 700° C. to 900° C. for about 2 hours to 4 hours using heating rate of about 250° C. to 350° C. per hour. The specimen is further processed as described in Example 1A to obtain article fabricated with the composition of Formula I. [The poled ceramic exhibits a uniform microstructure. The electromechanical properties are evaluated and are listed (for a disc shaped specimen) in Table 1].

(D) The metal oxides, carbonates and acetates are weighed in proportions according to the following formula:

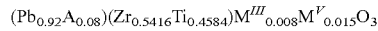

where

A is Sr;

$M^{III}$ is a combination of Cr and Mn; and $M^V$ is Nb;

Metal oxide/carbonate equivalents, PbO=209.9274 g, $SrCO_3$=11.8096 g, $ZrO_2$=66.7359 g, $TiO_2$=36.6124 g, $Mn_2O_3$=0.9472 g, $Cr_2O_3$=0.3039 g, and $Nb_2O_5$=3.9872 g are taken for preparation of the composition. The slurry is prepared similar to as described in Example 1A, and is dried. The dried powder is calcined more preferably at about 700° C. to 900° C. for about 2 hours to about 4 hours using heating rate of about 250° C. to 350° C. per hour. The specimen is further processed as described in Example 1A. [The poled ceramic exhibits a uniform microstructure. The electromechanical properties are evaluated and are listed (for a disc shaped specimen) in Table 1].

(E) The metal oxides, carbonates and acetates are weighed in proportions according to the following formula:

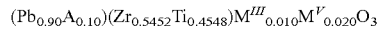

where

A is Sr, $M^{III}$ is a combination of Cr and Mn; and $M^V$ is Nb;

Metal oxide/carbonate equivalents, PbO=204.8465 g, $SrCO_3$=14.7620 g, $ZrO_2$=67.1795 g, $TiO_2$=36.3248 g, $Mn_2O_3$=0.7893 g, $Cr_2O_3$=0.7599 g, and $Nb_2O_5$=5.3162 g are taken for preparation of the composition. The slurry is prepared similar to as described in Example 1A and dried. The dried powder is calcined more preferably at about 700° C. to 900° C. for about 2 hours to about 4 hours using heating rate of about 250° C. to 350° C. per hour. The specimen is further processed as described in Example 1A. [The poled ceramic exhibits a uniform microstructure. The electromechanical properties are evaluated and are listed (for a disc shaped specimen) in Table 1].

(F) The metal oxides, carbonates and acetates are weighed in proportions according to the following formula:

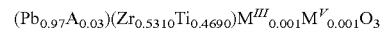

where

A is Ba;

$M^{III}$ is Cr; and $M^V$ is Ta;

Metal oxide/carbonate equivalents, PbO=222.8976 g, $ZrO_2$=65.4298 g, $TiO_2$=37.4590 g, $BaCO_3$=5.9199 g, $Cr_2O_3$=0.1519 g, and $Ta_2O_5$=0.4419 g are taken for preparation of the composition.

The procedure described above in Example 1 A was repeated, but using different compounds for 'A', '$M^{III}$', and '$M^V$' as disclosed above. The sample/specimen is further processed as described in Example 1A to obtain article fabricated with the composition of Formula I. [The poled ceramic exhibits a uniform microstructure. The electromechanical properties are evaluated and are listed (for a disc shaped specimen) in Table 1].

(G) The metal oxides carbonates and acetates are weighed in proportions according to the following formula:

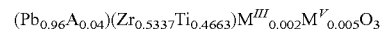

where

A is Ba;

$M^{III}$ is Nd; and $M^V$ is Ta;

Metal oxide/carbonate equivalents, PbO=220.1582 g, $ZrO_2$=65.7625 g, $TiO_2$=37.2433 g, $BaCO_3$=7.8932 g, $Nd_2O_3$=0.6729 g, and $Ta_2O_5$=2.2095 g are taken for preparation of the composition.

The procedure described above in Example 1 A was repeated, but using different compounds for 'A', '$M^{III}$', and '$M^V$' as disclosed above. The sample/specimen is further processed as described in Example 1A to obtain article fabricated with the composition of Formula I. [The poled ceramic exhibits a uniform microstructure. The electromechanical properties are evaluated and are listed (for a disc shaped specimen) in Table 1].

(H) The metal oxides, carbonates and acetates are weighed in proportions according to the following formula:

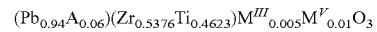

where

A is Ba;

$M^{III}$ is a combination of Nd and Mn;

$M^V$ is Ta;

Metal oxide/carbonate equivalents, PbO=215.0313 g, $BaCO_3$=11.8398 g, $ZrO_2$=66.2430 g, $TiO_2$=36.9239 g, $Mn_2O_3$=0.4736 g, $Nd_2O_3$=0.6729 g and $Ta_2O_5$=4.4190 g are taken for preparation of the composition. The slurry is prepared similar to as described in Example 1A, and is thereafter dried. The dried powder is calcined more preferably at about 700° C. to 900° C. for about 2 hours to 4 hours using heating rate of about 250° C.-350° C. per hour. The specimen is further processed as described in Example 1A to obtain article fabricated with the composition of Formula I. [The poled ceramic exhibits a uniform microstructure. The electromechanical properties are evaluated and are listed (for a disc shaped specimen) in Table 1].

(I) The metal oxides, carbonates and acetates are weighed in proportions according to the following formula:

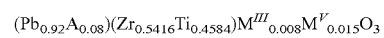

where
A is a combination of Sr and Ba;
$M^{III}$ is a combination of Cr, Nd and Mn;
$M^{V}$ is a combination of Nb and Ta;

Metal oxide/carbonate equivalents, PbO=209.9274 g, SrCO$_3$=8.8572 g, BaCO$_3$=3.9466 g, ZrO$_2$=66.7359 g, TiO$_2$=36.6124 g, Mn$_2$O$_3$=0.3157 g, Cr$_2$O$_3$=0.3039 g, Nd$_2$O$_3$=1.3459 g, Ta$_2$O$_5$=2.2095 g and Nb$_2$O$_5$=2.6581 g are taken for preparation of the composition. The slurry is prepared similar to as described in Example 1A, and is dried. The dried powder is calcined more preferably at about 700° C. to 900° C. for about 2 hours to about 4 hours using heating rate of about 250° C. to350° C. per hour. The specimen is further processed as described in Example 1A. [The poled ceramic exhibits a uniform microstructure. The electromechanical properties are evaluated and are listed (for a disc shaped specimen) in Table 1].

(J) The metal oxides, carbonates and acetates are weighed in proportions according to the following formula:

$$(Pb_{0.90}A_{0.10})(Zr_{0.5452}Ti_{0.4548})M^{III}_{0.010}M^{V}_{0.020}O_3$$

where,
A is Ba,
$M^{III}$ is Mn;
$M^{V}$ is Ta;

Metal oxide/carbonate equivalents, PbO=204.8465 g, BaCO$_3$=19.7330 g, ZrO$_2$=67.1795 g, TiO$_2$=36.3248 g, Mn$_2$O$_3$=1.5787 g, and Ta$_2$O$_5$=8.8380 g are taken for preparation of the composition. The slurry is prepared similar to as described in Example 1A and dried. The ried powder is calcined more preferably at about 700° C. to 900° C. for about 2 hours to about 4 hours using heating rate of about 250° C. to 350° C. per hour. The specimen is further processed as described in Example 1A. [The poled ceramic exhibits a uniform microstructure. The electromechanical properties are evaluated and are listed (for a disc shaped specimen) in Table 1].

Example 2

Electromechanical Characteristics of the Piezoceramic Articles Fabricated With the Composition(s) of the Present Disclosure The piezoceramic articles/specimens obtained in Examples 1A to 1J are evaluated for their electromechanical piezoceramic compositions/articles and the results are displayed in Table 1. Further, Table 2 discloses the electromechanical properties of currently known (commercially available and reported) piezoceramic compositions/articles for comparing and demonstrating the improved electromechanical properties of the present piezoceramic compositions.

TABLE 1

Electromechanical characteristics of the fabricated piezoceramics compositions as given in Examples 1A to 1J

| Properties | Example 1A | Example 1B | Example 1C | Example 1D | Example 1E | Example 1F | Example 1G | Example 1H | Example 1I | Example 1J |
|---|---|---|---|---|---|---|---|---|---|---|
| Density (gm/cc) | 7.6 | 7.5 | 7.5 | 7.6 | 7.5 | 7.5 | 7.7 | 7.5 | 7.7 | 7.5 |
| $\varepsilon_r$ | 1349 | 1279 | 1754 | 1452 | 1228 | 962 | 1055 | 847 | 810 | 1100 |
| Tanδ | 0.003 | 0.003 | 0.002 | 0.002 | 0.002 | 0.002 | 0.002 | 0.002 | 0.002 | 0.002 |
| $k_p$ | 0.60 | 0.57 | 0.61 | 0.59 | 0.56 | 0.55 | 0.55 | 0.57 | 0.54 | 0.55 |
| $Q_m$ | 354 | 1097 | 665 | 825 | 250 | 389 | 316 | 711 | 807 | 957 |
| $d_{33}$ (pC/N) | 405 | 359 | 465 | 420 | 385 | 255 | 255 | 260 | 244 | 240 |
| $g_{33}$ (mV/N) | 33 | 31 | 29 | 32 | 35 | 56 | 56 | 58 | 57 | 56 |
| $T_c$ (° C.) | 330 | 330 | 330 | 330 | 330 | 395 | 395 | 390 | 390 | 390 |
| IR (GΩ), at 1000 VDC | 120 | 130 | 400 | 350 | 170 | 120 | 150 | 200 | 130 | 140 |

TABLE 2

Electromechanical characteristics of commercially available and reported piezoceramics (prior art)

| Properties | Commercially available compositions | | Morgan PZT-401 | U.S. Pat. No. 3,376,226[b] | U.S. Pat. No. 3,268,453[b] | U.S. Pat. No. 3,546,120[b] |
|---|---|---|---|---|---|---|
| | Sparkler SP-4 | | | | | |
| Density (gm/cc) | 7.6 | | 7.6 | NR[a] | 7.4 | NR |
| $\varepsilon_r$ | 1250 | | 1470 | NR | 742 | NR |
| Tanδ | 0.004 | | 0.002 | NR | 0.008 | NR |
| $k_p$ | 0.60 | | 0.60 | 0.58 | 0.45 | 0.69 |
| $Q_m$ | 500 | | 600 | 360 | 1577 | 1632 |
| $d_{33}$ (pC/N) | 300 | | 315 | NR | NR | NR |
| $g_{33}$ (mV/N) | 26 | | 27 | NR | NR | NR |

TABLE 2-continued

Electromechanical characteristics of commercially available and reported piezoceramics (prior art)

| | Commercially available compositions | | | | |
|---|---|---|---|---|---|
| Properties | Sparkler SP-4 | Morgan PZT-401 | U.S. Pat. No. 3,376,226[b] | U.S. Pat. No. 3,268,453[b] | U.S. Pat. No. 3,546,120[b] |
| $T_c$ (° C.) | 325 | 330 | NR | NR | NR |
| IR (GΩ), at 1000 VDC | NR | NR | NR | NR | NR |

[a]NR—Not Reported
[b]the compositions of this prior art have been chosen which have been reported to exhibit reasonably acceptable values for the maximum number of parameters.

It is clear from Table 1 that the present compositions under Formula I (Examples 1A to 1F), produces superior electromechanical properties over known compositions of the prior art. In particular, compositions having lower values of tan δ (<0.002), increase in $Q_m$, and increase in IR while maintaining reasonably good values of $ε_r$, $k_p$, $d_{33}$ and $g_{33}$ are desirable and the same is provided by the compositions of the present disclosure. Further the composition (Example 1C) produces a material which has the highest values of dielectric constant ($ε_r$=1754), electromechanical coupling efficiency ($k_p$=0.61), optimum mechanical quality factor ($Q_m$=665) and lower dielectric loss (tan δ=0.002) along with one order gain in insulation resistance (IR=400 GΩ). Similarly, other compositions under Examples 1A, 1B, 1D,1E, 1F, 1G, 1H, 1I and 1J also effectively showcase improved electromechanical properties including high insulation resistance (IR). Thus, the compositions of the present disclosure are superior in all properties and are able to successfully overcome the various drawbacks of prior art by providing improved piezoceramic articles.

In conclusion, the present disclosure introduces piezoceramic compositions and materials thereof possessing significantly improved properties of dielectric constant/permittivity ($ε_r$), electromechanical coupling efficiency ($k_p$), mechanical quality factor ($Q_m$) and dielectric loss (tan δ) along with insulation resistance (IR). In other words, the piezoceramic compositions of the present disclosure achieve enhanced IR in conjunction with other properties which was lacking in the piezoceramic compositions of the prior art. The disclosure also provide for improved process for preparing the present piezoceramic compositions and articles thereof.

We claim:
1. A composition of Formula I

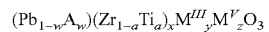

wherein,
'A' is selected from a group consisting of Sr and Ba, or a combination thereof;
'$M^{III}$' is selected from a group consisting of Cr, Nd and Mn, or any combination thereof;
'$M^V$' is selected from a group consisting of Nb and Ta, or a combination thereof;
"a" corresponds to Zr/Ti ratio;
'w' ranges from about 0.80 to 2.70 wt %;
'y' ranges from about 0.017 to 0.170 wt %;
'z' ranges from about 0.03 to 0.60 wt %; and
'x' ranges from about 0.96768 to 0.99800.

2. The composition as claimed in claim 1, wherein said composition is a piezoelectric ceramic composition.

3. The composition as claimed in claim 1, wherein the ratio of Zr:Ti range from about 0.8867 to about 1.1276; and wherein the ratio of $M^{III}$:$M^V$ range from about 1.0 to 0.40.

4. The composition as claimed in claim 1, wherein said composition possess permittivity ($ε_r$) ranging from about 1279 to 1754, electromechanical coupling efficiency ($k_p$) ranging from about 0.57 to 0.61, mechanical quality factor ($Q_m$) ranging from about 665 to 1097, and dielectric loss (tan δ) ranging from about 0.002 to 0.003.

5. The piezoelectric composition as claimed in claim 1, wherein said composition possess insulation resistance (IR) ranging from 130GΩ to about 400GΩ.

* * * * *